US007309887B2

(12) United States Patent
Osipov et al.

(10) Patent No.: US 7,309,887 B2
(45) Date of Patent: Dec. 18, 2007

(54) FERROMAGNETIC-SEMICONDUCTOR SPIN POLARIZER OF ELECTRONS IN NONMAGNETIC SEMICONDUCTORS

(76) Inventors: Viatcheslav V. Osipov, 785 Carole Ct., East Palo Alto, CA (US) 94303; Yorgos Stylianos, 10655 Blythe Ave., Los Angeles, CA (US) 90064

( * ) Notice: Subject to any disclaimer, the term of this patent is extended or adjusted under 35 U.S.C. 154(b) by 0 days.

(21) Appl. No.: 11/071,535

(22) Filed: Mar. 4, 2005

(65) Prior Publication Data

US 2006/0197128 A1 Sep. 7, 2006

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ...................................... 257/295; 257/421

(58) Field of Classification Search ................ 257/295, 257/421–427

See application file for complete search history.

(56) References Cited

U.S. PATENT DOCUMENTS

2005/0006682 A1* 1/2005 Bae et al. ................... 257/295

OTHER PUBLICATIONS

Zutic, J. Fabian, and S. Das Sarma, Spintronics: Fundamentals and Applications, Rev. Mod. Phys. 76, 323 (2004).

"Semiconductor Spintronics and Quantum Computation", edited by D. D. Awschalom, D. Loss, and N. Samarth (Springer, Berlin, 2002).

M. Baibich, et al.,Giant Magnetoresistance of (001) Fe/(001)Cr Magnetic Superlattices, Phys. Rev. Lett. 61, 2472 (1988).

N. Garcia et al., Negative and Positive Magnetoresistance Manipulation in an Electrodeposited Nanometer Ni Contact, Phys. Rev. Lett. 82, 2923 (1999).

S. Datta and B. Das, Appl. Phys. Lett. 56, 665 (1990).

R.Sato and K. Mizushima, Spin Valve Transistor with an Fe/Au/Fe(001) Base, Appl. Phys. Lett. 79, 1157 (2001).

A. M. Bratkovsky et al, High-Frequency Spin-Valve Effect in a Ferromagnet-Semicnductor-Ferromagnet Structure Structure Based. Phys. Rev. Lett. 92, 098302 (2004).

V. V. Osipov and A. M. Bratkovsky, A Class of Spin Injection-Precession Ultrafast Nanodevices, Appl. Phys. Lett. 84, 2118 (2004).

V. V. Osipov et al, Investigation of heterostructure "ferromagnetic semiconductor" in the millimeter and submillimeter microwave range, Phys. Lett. A 247, 353 (1998).

(Continued)

*Primary Examiner*—Thien F Tran
(74) *Attorney, Agent, or Firm*—Ash Tankha of Counsel, Lipton, Weinberger & Husick

(57) ABSTRACT

An efficient spin polarizer in nonmagnetic semiconductors is provided. Previous spin injection devices suffered from very low efficiency (less than 35%) into semiconductors. An efficient spin polarizer is provided which is based on ferromagnetic-semiconductor heterostructures and ensures spin polarization of electrons in nonmagnetic semiconductors close to 100% near the ferromagnetic-semiconductor junctions at wide temperature intervals ranging from very low temperatures to room temperatures even in the case when spin polarization of electrons in the ferromagnetic layer is relatively low.

22 Claims, 9 Drawing Sheets

OTHER PUBLICATIONS

A. T. Hanbicki, et al, Efficient electrical spin injection from a magnetic metal tunnel barrier contact into a semiconductor, Appl. Phys. Lett. 80, 1240 (2002).
H. Ohno, Spin Polarized Electron Injection Through an Fe/InAs Junction, Jpn. J. Appl. Phys. 42, L1 (2003).
P. R. Hammar, et al, Observation of Spin Injection at a Ferromagnet-Semiconductor Interface, Phys. Rev. Lett. 83, 203 (1999).
S. M. SIze, Physics of Semiconductor Devices (Wiley, New York, 1981).
V.V. Osipov et al, Efficient nonlinear room-temperature spin injection from ferromagnets into semiconductors through modified Schottky barrier, Phys. Rev. B 70, 205312 (2004).
A.M. Bratkovsky, et al, Efficient spin extraction from nonmagnetic semiconductors near forward-biased ferromagnetic-semiconductor J. Appl. Phys. 96, 4525 (2004).
A. G. Aronov and G. E. Pikus, Spin injection into semiconductors, Sov. Phys. Semicond. 10, 698 (1976).
Z. G. Yu and M. E. Flatte, Electric-field dependent spin diffusion and spin injection into semiconductors, Phys. Rev. B 66, R201202 (2002).
C. B. Duke, Tunneling in Solids (Academic, New York, 1969).
A. M. Bratkovsky, Tunneling of electrons in conventional and half-metallic systems: Towards very large magnetoresistance, Phys. Rev. B 56, 2344 (1997).
Y. Ohno et al., Electrical spin injection in a ferromagnetic semiconductor heterostructure, Nature 402, 790 (1999).
R.E. Camley et al., Theory of Giant Magnetoresistance Effects in Magnetic Layered Structure with Antiferromagnetic Coupling, Phys. Rev. Lett. 63, 664 (1989).
T. Manago et al., Spin-Polarized light-emitting diode using metal/insulator/semiconductor structures, Appl. Phys. Lett. 81, 694 (2002).
J. Barnas et et al., Phys. Rev. B 42, 8110 (1990).
G. A. Prinz, Magnetoelectronics, Science 282, 1660 (1998).
G. Tatara et al., Domain Wall Scattering Explains 300% Ballistic Magnetoconductance of Nanocontacts, Phys. Rev. Lett. 83, 2030 (1999).
N. Garcia et al., Magnetoresistance in excess of 200% in Ballistic Ni Nanocontacts at Room Temperature and 100Oe, Phys. Rev. Lett. 82, 2923 (1999).
S. H. Chung et al., Universal Scaling of Ballistic Magnetoresistance in Magnetic Nanocontacts, Phys. Rev. Lett, 89, 287203 (2002).
S. Gardelis et al., Spin-valve effects in a semiconductor field-effect transistor: A spinotronic device, Phys. Rev. B 60, 7764 (1999).
X. Jiang et al., Optical Detection of Hot-electron Spin injection into GaAs from a Magnet Tunnel Transistor Source, Phys. Rev. Lett. 90, 256603 (2003).
A. F. Motsnyi et al., Electrical spin injection in a ferromagnet/tunnel barrier/semiconductor heterostructure, Appl. Phys. Lett., 81, 265 (2002).
R. Fiederling et al., Injection and detection of a spin polarized current in a light-emitting diode , Nature 402, 787 (1999).
A. T. Hanbiki et al, Analysis of the transport process providing spin injection through an Fe/AlGaAs Schottky barrier, Appl. Phys. Lett, 82, 4092 (2003).
R. Fiederling et al., Injection and detection of a spin-polarized current in a light-emitting diode, Nature 402, 787 (1999).
M. Tanaka et al., Large Tunneling Magnetoresistance in GaMnAs/AlAs/GaMnAs Ferromagnetic Semiconductor Tunnel Junctions, Phys. Rev. Lett. 87, 026602 (2001).
H.J. Zhu et al., Room-Temperature Spin Injection from Fe into GaAs, Phys. Rev. Lett. 87, 016601 (2001).
W. Y. Lee et al., Magnetization reversal and magnetoresistance in a lateral spin-injection device, J. Appl. Phys. 85, 6682 (1999).
G. Binasch et al., Enhanced Magnetoresistance in layered Magnetic Structures With Antiferromagnetic Interlayer Exchange, Phys. Rev. 39, 4828 (1999).

* cited by examiner

FERROMAGNETIC-SEMICONDUCTOR SPIN POLARIZER OF ELECTRONS IN NONMAGNETIC SEMICONDUCTORS

BACKGROUND OF THE INVENTION

1. Field of the Invention

In general, the present invention relates to spintronics. In particular, the present invention relates to creating a spin polarization of virtually all of the electrons in nonmagnetic semiconductors at an arbitrary spin polarization current in ferromagnetic material and at a wide range of temperatures including room temperature.

2. Description of the Related Art

The entire contents of each document listed below is expressly incorporated herein by reference:

[1] I. Zutic, J. Fabian, and S. Das Sarma, Spintronics: Fundamentals and applications, Rev. Mod. Phys. 76, 323 (2004).

[2] "Semiconductor Spintronics and Quantum Computation", edited by D. D. Awschalom, D. Loss, and N. Samarth (Springer, Berlin, 2002).

[3] M. Baibich, J. M. Broto, A. Fert, F. Nguyen Van Dau, F. Petroff, P. Eitenne, G. Creuzet, A. Friederich, and J. Chazelas, Phys. Rev. Lett. 61, 2472 (1988); R. E. Camley and J. Barnas, Phys. Rev. Lett. 63, 664 (1988); G. Binasch et al., Phys. Rev. B 39, 4828 (1989); J. Barnaset et al., Phys. Rev. B 42, 8110 (1990); G. A. Prinz, Science 282, 1660 (1998).

[4] N. Garcia et al., Phys. Rev. Lett. 82, 2923 (1999); G. Tatara et al., ibid. 83, 2030 (1999); N. Garcia et al., Phys. Rev. Lett. 85, 3053 (2000); S. H. Chunget al., ibid. 89, 287203 (2002).

[5] S. Datta and B. Das, Appl. Phys. Lett. 56, 665 (1990); S. Gardelis, C. G. Smith, C. H. W. Barnes, E. H. Linfield, and D. A. Ritchie, Phys. Rev. B 60, 7764 (1999).

[6] R. Sato and K. Mizushima, Appl. Phys. Lett. 79, 1157 (2001); X. Jiang, R. Wang, S. van Dijken, R. Shelby, R. Macfarlane, G. S. Solomon, J. Harris, and S. S. P. Parkin, Phys. Rev. Lett. 90, 256603 (2003).

[7] A. M. Bratkovsky and V. V. Osipov, Phys. Rev. Lett. 92, 098302 (2004);

[8] V. V. Osipov and A. M. Bratkovsky, Appl. Phys. Lett. 84, 2118 (2004).

[9] V. V. Osipov, N. A. Viglin, and A. A. Samokhvalov, Phys. Lett. A 247, 353 (1998); Y. Ohno, D. K. Young, B. Beschoten, F. Matsukura, H. Ohno, and D. D. Awschalom, Nature 402, 790 (1999); R. Fiederling, M. Keim, G. Reuscher, W. Ossau, G. Schmidt, A. Waag, and L. W. Molenkamp, ibid. 402, 787 (1999).

[10] A. T. Hanbicki, B. T. Jonker, G. Itskos, G. Kioseoglou, and A. Petrou, Appl. Phys. Lett. 80, 1240 (2002); A. T. Hanbicki, O. M. J. van't Erve, R. Magno, G. Kioseoglou, C. H. Li, and B. T. Jonker, ibid. 82, 4092 (2003).

[11] H. Ohno, K. Yoh, K. Sueoka, K. Mukasa, A. Kawaharazuka, and M. E. Ramsteiner, Jpn. J. Appl. Phys. 42, L1 (2003).

[12] P. R. Hammar, B. R. Bennett, M. J. Yang, and Mark Johnson, Phys. Rev. Lett. 83, 203 (1999); Y. Ohno et al., Nature 402, 790 (1999); R. Fielderling et al., Nature 402, 787 (1999); M. Tanaka and Y. Higo, Phys. Rev. Lett. 87, 026602 (2001); H. J. Zhu, M. Ramsteiner, H. Kostial, M. Wassermeier, H.-P. Schönherr, and K. H. Ploog, ibid. 87, 016601 (2001); W. Y. Lee, S. Gardelis, B.-C. Choi, Y. B. Xu, C. G. Smith, C. H. W. Barnes, D. A. Ritchie, E. H. Linfield, and J. A. C. Bland, J. Appl. Phys. 85, 6682 (1999); T. Manago and H. Akinaga, Appl. Phys. Lett. 81, 694 (2002); A. F. Motsnyi, J. De Boeck, J. Das, W. Van Roy, G. Borghs, E. Goovaerts, and V. I. Safarov, ibid. 81, 265 (2002).

[13] S. M. Sze, Physics of Semiconductor Devices (Wiley, New York, 1981.

[14] V. V. Osipov and A. M. Bratkovsky, Phys. Rev. B 70, 205312 (2004); Cond-mat/0307030 (2003).

[15] A. M. Bratkovsky and V. V. Osipov, J. Appl. Phys. 96, 4525 (2004).

[16] A. G. Aronov and G. E. Pikus, Fiz. Tekh. Poluprovodn. 10, 1177 (1976) [Sov. Phys. Semicond. 10, 698 (1976].

[17] Z. G. Yu and M. E. Flatte, Phys. Rev. B 66, R201202 (2002).

[18] C. B. Duke, Tunneling in Solids (Academic, New York, 1969).

[19] A. M. Bratkovsky, Phys. Rev. B 56, 2344 (1997).

Over the past decade, new ventures in solid state electronic devices based on both the electron density and spin of electrons has led to the development of a new field: spintronics. Spintronics is the manipulation of electron spin in solid state materials. Spintronics creates the possibilities for designing ultra-fast, low-power scalable devices and applications for quantum computing. Among the practical spintronic effects is a giant magnetoresistance (GMR) in magnetic multilayers and tunnel ferromagnet-insulator-ferromagnet (FM-I-FM) structures. Discovery of GMR in magnetic multilayers has quickly led to important applications in storage technology. GMR is a phenomenon in which a relatively small change in a magnetic field results in a large change in the resistance of the material. The phenomenon of a large tunnel magnetoresistance (TMR) of FM-I-FM structures is being studied by product development teams in many leading companies. TMR is typically observed in FM-I-FM structures made of two ferromagnetic layers of similar or different materials, separated by an insulating thin tunnel barrier I, with thickness ranging between 1.4-2 nm. The tunnel current through the structure may differ significantly depending on whether the magnetic moment is parallel (low resistance) or anti parallel (high resistance). For example, in ferromagnets such as $Ni_{80}Fe_{20}$, Co—Fe, and the like, resistance may differ by up to 50% at room temperature for parallel (low resistance) versus antiparallel (high resistance) moments on ferromagnetic electrodes.

Recently, studies have been made in regard to giant ballistic magnetoresistance of Ni nano-contacts. Ballistic magnetoresistance is observed in Ni and some other nanowires in which the typical cross-section of the nano-contacts of the nanowire is a few square nanometers. The transport in this case is through very short constriction and it is believed to be with conservation of electron momentum (ballistic transport). The change in the contact resistance can exceed 20-fold.

Of particular interest is injection of spin-polarized electrons into nonmagnetic semiconductors, because of the relatively large spin-coherence lifetime of electrons and the possibility of controlling the electron spin by external fields. The use of different ferromagnetic-semiconductor-ferromagnetic (FM-S-FM) heterostructures have recently been suggested, including those using an electric field, an external magnetic field, and a nanowire current. All the proposed spintronic devices are spin valves in which one of the ferromagnetic-semiconductor junctions works as a spin injector, and another one works as a spin polarizer (spin filter). Spin injection into nonmagnetic semiconductors (NS) holds promise both for the new generation of high-speed low-power electronic devices and quantum computing.

Relatively efficient spin injection in heterostructures with magnetic semiconductor as a spin source has been reported in {Refs. [9]}, the entire contents of which are expressly incorporated herein by reference. High enough spin injection from ferromagnets into nonmagnetic semiconductors has recently been demonstrated at low temperatures. However, the highest degree of spin polarization (the amount of electrons whose spin is coherent, or oriented the same) of injected electrons in nonmagnetic semiconductors, $P_n$, observed in all of existent works was less than 32% at low temperatures, and less than 10% at room temperatures. Thus far, all of the attempts to achieve higher spin polarization have faced fundamental difficulties.

The principal difficulty of the spin injection from a ferromagnetic (FM) into a nonmagnetic semiconductor is that a potential barrier (Schottky barrier) always arises in the semiconductor near the metal-semiconductor interface. Numerous experiments show that the barrier height Δ is determined by surface states forming on the interface, and is approximately (⅔) $E_g$, practically independently of the type of the metal. $E_g$ is the energy band gap of the semiconductor, that is, the difference between the conduction band energy level $E_C$ and the valence band energy level $E_V$. For example, for GaAs and Si the barrier height is equal to 0.5 eV-0.8 eV, with practically all metals, including Fe, Ni, and Co, and the barrier width, the length of the Schottky depleted layer $l_D$, is relatively large ($l_D \approx 40$ nm for doping concentration $N_d \approx 10^{17}$ $cm^{-3}$).

FIG. 1A illustrates a schematic of a conventional FM-S Schottky junction 100. As shown, the spin-injection junction 100 includes a semiconductor 110 and a ferromagnetic (FM) layer 120 above the semiconductor 110. The device 100 also includes electrodes 130 and 140 connected to the ferromagnetic layer 120 and the semiconductor 110. As will be described below, the Schottky barrier forms in such a way that the junction is very wide, which makes tunneling of electrons practically impossible.

FIG. 1B illustrates an energy band diagram of the conventional spin-injection device 100, illustrated in FIG. 1A. The barrier for electrons has a height Δ and width l (which is the thickness of the Schottky depletion layer).

The amount of spin injection from FM into NS materials is determined by the current in reverse direction through the Schottky barrier, minus bias voltage applied to the FM (electron flow is directed from FM to semiconductor, and the current is directed to opposite direction). This current is usually extremely small, mainly due to the relatively large Schottky depleted layer $l_D$ and $\Delta \gg k_B T$, where $k_B$ is the Boltzmann constant and T is the device temperature. In the forward-biased FM-S (ferromagnetic semiconductor) Shottky junctions, a minus-bias voltage is applied to the semiconductor, and the current can reach a large value only at a bias voltage qV close to Δ, where q is the elementary charge.

Realization of an efficient spin polarization in nonmagnetic semiconductors (NS) due to such a thermoemission current is problematic for several reasons. First, electrons in $FM^s$ with an energy F+Δ are weakly spin polarized, where F is the Fermi level. Second, according to standard theory, the thermionic current through Schottky junctions depends solely on the parameters of the semiconductor and not on the parameters of the metallic ferromagnet {13}. Therefore, the current could formally be spin-polarized in Schottky contacts. Thus, the effective spin injection in the conventional FM-S Schottky junction 100 is impossible for all practical purposes.

It has been proposed to use an ultrathin heavily doped semiconductor layer (δ-doped layer) between the FM material and a nondegenerate nonmagnetic semiconductor to increase the spin injection at room temperature, as shown in FIG. 2A. This δ-doped layer of a thickness $l_+$ℵ 1 nm sharply reduces the thickness of the Schottky barrier, and increases its tunneling transparency. According to {14, "EFFICIENT NONLINEAR ROOM-TEMPERATURE SPIN INJECTION FROM FERROMAGNETS INTO SEMICONDUCTORS THROUGH A MODIFIED SCHOTTKY BARRIER", V. V. Osipov and A. M. Bratkovsky, Phys. Rev. B 70, 205312 (2004); cond-mat/0307030 (2003).}, the entire contents of which are expressly incorporated herein by reference, the thickness of the δ-doped layer, $l_+$, should be on the order of a typical tunneling length for the barrier $l_+$ℵ $l_0$ where $$l_0=(h^2/8\pi^2 m^*\Delta)^{1/2} \tag{1}$$

And m* is the effective mass of electrons in the semiconductor δ-doped layer. Moreover, the bottom of conduction band, $E_{c0}$, in the semiconductor δ-doped layer and the nonmagnetic in equilibrium should be higher than the Fermi level, $E_{c0}>F$. The semiconductor has to be nondegenerate in whole semiconductor region including the δ-doped layer, as shown in FIG. 2B. It has been shown theoretically that spin polarization in the nonmagnetic semiconductor, $P_n$, both in the reverse-biased and forward-biased FM-S junction can approach that in the FM material at an electron energy of $E \approx E_c$. In the reverse-biased FM-S junction, the predictable value of $P_n$ can achieve a maximum, $P_{max}$, at room temperatures when $E_c$ corresponds to a spike of density of minority electron states in the FM material, as shown in FIG. 2B. Even a theoretical value of $P_{max}$, however is substantially smaller than 1 at room temperatures and $P_n=0$ at low temperatures. In the forward-biased FM-S junction, $P_{max}$ is determined by spin polarization of current in the FM material which is substantially smaller than 1 (by about 30%-40%) {see [15]}.

Characteristics of all of spintronic devices improve dramatically with increase in the degree of the electron spin polarization, P.sub.n, and achieve to them, limited values when $P_n=1$ (100%). Moreover, a fundamental problem for quantum computing is to obtain an electron spin polarization in nonmagnetic semiconductors (NS) of P.sub.n=100% at very low temperatures, such as, T<1.degree. K.

SUMMARY OF THE INVENTION

An object of the present invention is to substantially solve at least the above problems and/or disadvantages and to provide at least the advantages described below. Accordingly, it is an object of the present invention to provide a spin polarizer comprising a semiconductor, a ferromagnetic layer, and a thin degenerate semiconductor layer formed between the ferromagnetic layer and the semiconductor which is more highly doped than the semiconductor layer. The concentration of shallow donors N.sub.d.sup.+ in this layer satisfies the condition: 4.pi.N.sub.d.sup.+a.sub.B-.sup.3/3>1, where a.sub.B is Borh radius of the shallow donor; the thickness, l, of this layer satisfies a condition: 6l.sub.0.ltoreq.2l.sub.D.ltoreq.l<<L.sub.S.sup.+wherein:

l.sub.0 represents a tunneling length for a Schottky barrier between the ferromagnetic layer and the thin degenerate semiconductor layer given by the equation l.sub.0=(h.sup.2/8.pi..sup.2m*.DELTA.).sup.1/2 l.sub.D represents a thickness of the Schottky barrier given by l.sub.D=(2.epsilon..epsilon..sub.0.DELTA./q.sup.2N.sub.d.sup.+).sup.1/2 wherein .epsilon..sub.0 is the permittivity of free space, .epsilon. is the relative permittivity of the thin degenerate semiconductor layer, q>0 is the elementary charge, and N.sub.d.sup.+is the concentration of shallow donors in the highly doped degenerate semiconductor layer, .DELTA. is a height of the Schottky barrier; and L.sub.S.sup.+ represents a length of electron spin relaxation in the thin degenerate semiconductor layer given by the L.sub.S.sup.+={square root over (D.sup.+.tau..sub-.s.sup.+)} where D.sup.+ and .tau..sub.S.sup.+ are diffusion coefficient and time of spin coherence of electrons in the thin degenerate semiconductor n.sup.+-S layer, respectively.

According to an embodiment of the present invention, efficient spin polarizer of electrons in nonmagnetic semiconductors that are ferromagnetic-semiconductor heterostructures comprises a magnetic semiconductor layer or ferromagnetic metal layer, a nonmagnetic semiconductor, and a thin high doped degenerate semiconductor layer, satisfying certain requirements and situated between the ferromagnetic layer and the nonmagnetic semiconductor. The spin polarizer ensures spin polarization of electrons in the nonmagnetic semiconductor at substantially 100% near the ferromagnetic-semiconductor junctions at temperatures ranging from very low temperatures (T<1° K.) to room temperatures.

BRIEF DESCRIPTION OF THE DRAWINGS

The various objects, advantages and novel features of the present invention will be best understood by reference to the detailed description of the preferred embodiments that follow, when read in conjunction with the accompanying drawings, in which.

Throughout the drawings, like reference numbers will be understood to refer to like elements, features and structures.

DETAILED DESCRIPTION OF EXEMPLARY EMBODIMENTS

Several embodiments of the present invention will now be described in detail with reference to the annexed drawings. In the following description, detailed descriptions of known functions and configurations incorporated herein have been omitted for conciseness and clarity.

For simplicity and illustrative purposes, the principles of the present invention are described by referring mainly to exemplary embodiments thereof. In the following description, numerous specific details are set forth in order to provide a thorough understanding of the present invention. Those with skill in the art will recognize that various changes and modifications can be made to the examples provided herein without departing from the scope and spirit of the invention.

The exemplary embodiments of the present invention are a spin polarizer that in the general case, can contain a ferromagnetic-semiconductor (FM-S) junction ensuring a spin polarization of current, $P_J$, near a boundary with a nonmagnetic semiconductor (NS) depending relatively weakly on the current. The spin polarizer can create spin polarization of electrons virtually to 100%, inside some areas of the nonmagnetic semiconductor (NS) near the FM-S junction. This occurs when the electrons drift under the action of a strong enough electrical field from the NS into the FM even in the case when $P_J$ is relatively small ($P_j$ can be even ~5%-15%).

Figure 3A:
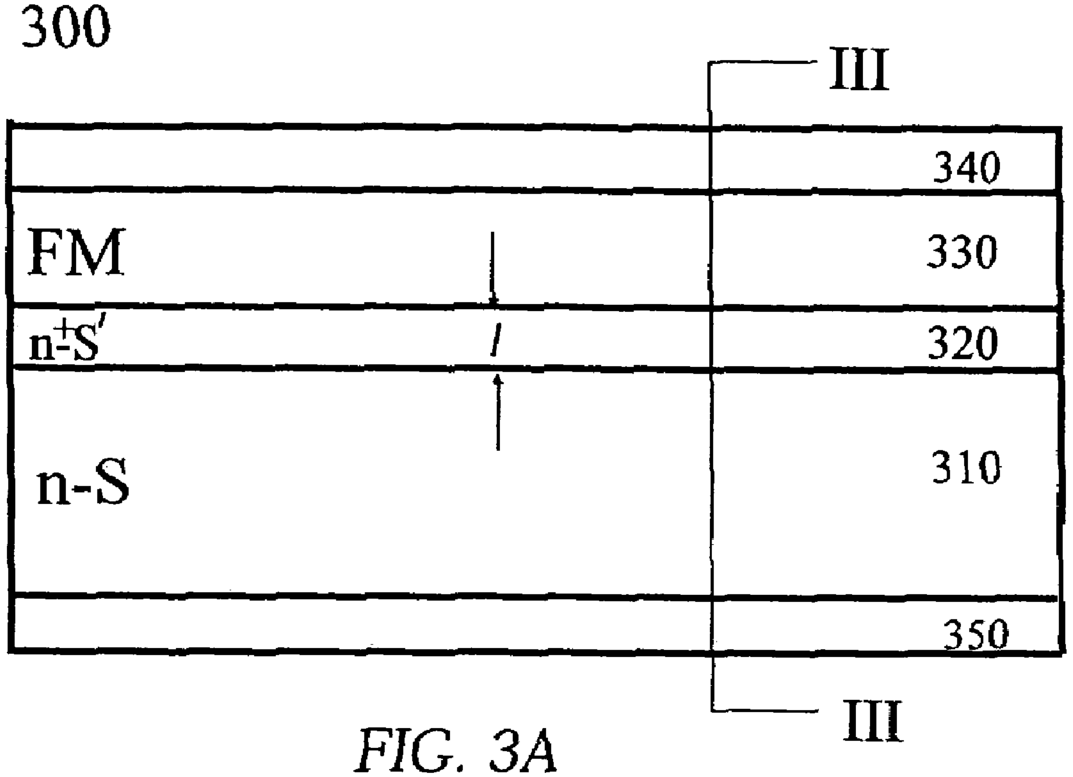
FIG. 3A illustrates an exemplary variant of a spin polarizer according to an embodiment of the present invention based on a ferromagnetic-semiconductor heterostructure including a thin high negative doped degenerate semiconductor layer, n+-S' layer that is situated between the ferromagnetic layer and negative doped semiconductor (n-S region), and has a narrower energy bandgap than that of the n-S region.

FIG. 3A illustrates a spin polarizer 300 according to an embodiment of the present invention. As will be discussed below, the device 300 can ensure spin polarization of electrons is equal virtually to 100% inside some area of the nonmagnetic semiconductor (NS) near the FM-S junction. The spin polarizer 300 includes a nonmagnetic semiconductor (NS) layer 310, a thin, highly doped degenerate semiconductor layer $n^+$-S' 320, above the semiconductor 310 and a ferromagnetic (FM) layer 330 above the semiconductor layer 320. The spin polarizer 300 can also include electrodes 340 and 350 electrically connecting the ferromagnetic layer 330 and the NS layer 310, respectively. The spin polarizer 300 thus formed is described as having an FM-$n^+$-S'-n-S heterostructure with parameters adjusted to sufficiently meet the conditions discussed below.

The FM layer 330 can be formed from various magnetic materials, preferably Ni, Fe and Co, as well as various magnetic alloys, which can include one or a combination of Fe, Co, and Ni. The NS layer 310 can be formed from various semiconductor materials including any one of Si, GaAs, ZnTe, GaSb, GaP, Ge, InAs, CdSe, InP, InSb, CdTe, CdS, ZnS, ZnSe, AlP, AlAs, AlSb, and also alloys of these materials. In an exemplary embodiment of the present invention, the semiconductor 310 can be formed from semiconductor materials with relatively large electron spin relaxation time, $L_S$. These include, for example GaAlAs, InAs, ZnSe and ZnCdSe among others. The NS layer 310 can be negatively doped. Negative dopant metals that can be used include P, As, Sb for Si and Ge, and Ge, Se, Te, Si, Pb and Sn for GaAs.

The high doped semiconductor, the $n^+$-S' layer 320, may be formed from various semiconductor materials having an energy bandgap narrower than that for the semiconductor 310. For example, the n-dopant metals may be P, As, Sb for Si and Ge, and Ge, Se, Te, Si, Pb and Sn for GaAs. The thin degenerate semiconductor layer 320 may be used to increase tunneling transparency of the Schottky barrier for electrons with energies E>F and to ensure a spin polarization of current near the FM-n+-S' junction weakly depending on the current. The parameters of the $n^+$-S' layer 320 should be satisfied by certain conditions listed below.

Figure 3B:
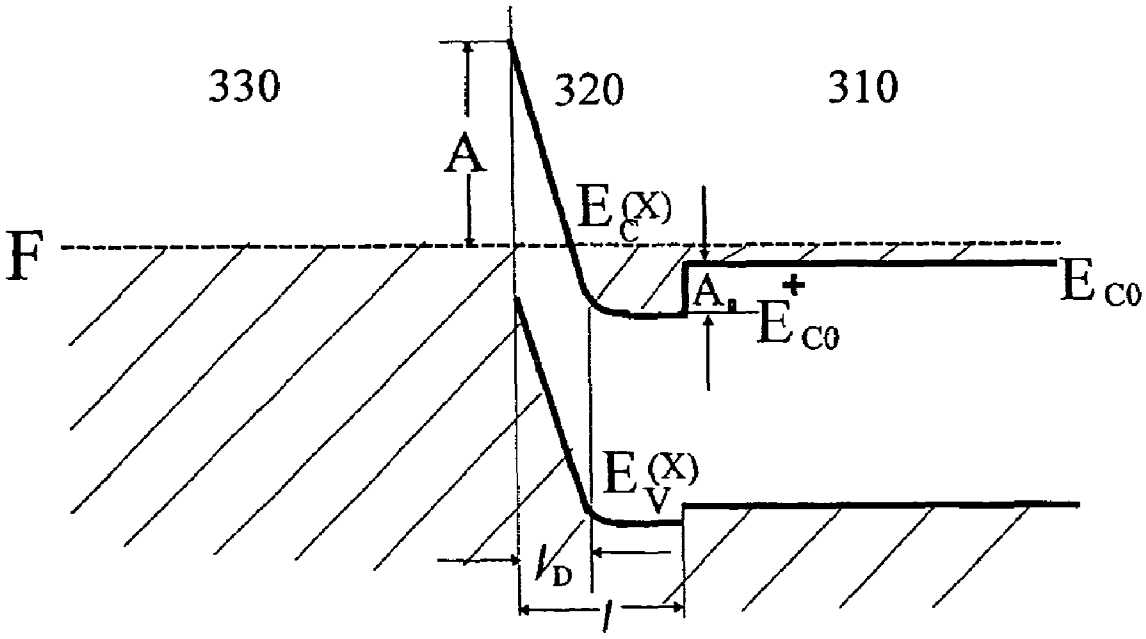
FIG. 3B illustrates an exemplary energy diagram of spin polarizer shown in FIG. 3A along the line III-III in the case when the n-S region is a degenerate semiconductor.

FIG. 3B illustrates an exemplary energy diagram of spin polarizer 300 along the line III-III of FIG. 3A in the case when the n-S region 310 is a degenerate nonmagnetic semiconductor. The device 300 can be used at an arbitrary temperature and can ensure spin polarization of electrons close to 100% in an area of the nonmagnetic semiconductor near the boundary with the $n^+$-S' layer 320. F is the Fermi level; .DELTA. and l.sub.D are the height and thickness of the Schottky barrier of the FM-$n^+$-S' junction, l is the thickness of the highly doped $n^+$-S' layer 320, $\Delta_0$ is a jump at the bottom of the conduction band, $E_c(x)$, at the boundary of the $n^+$-S' layer 320 and the semiconductor 310.

Figure 3C:
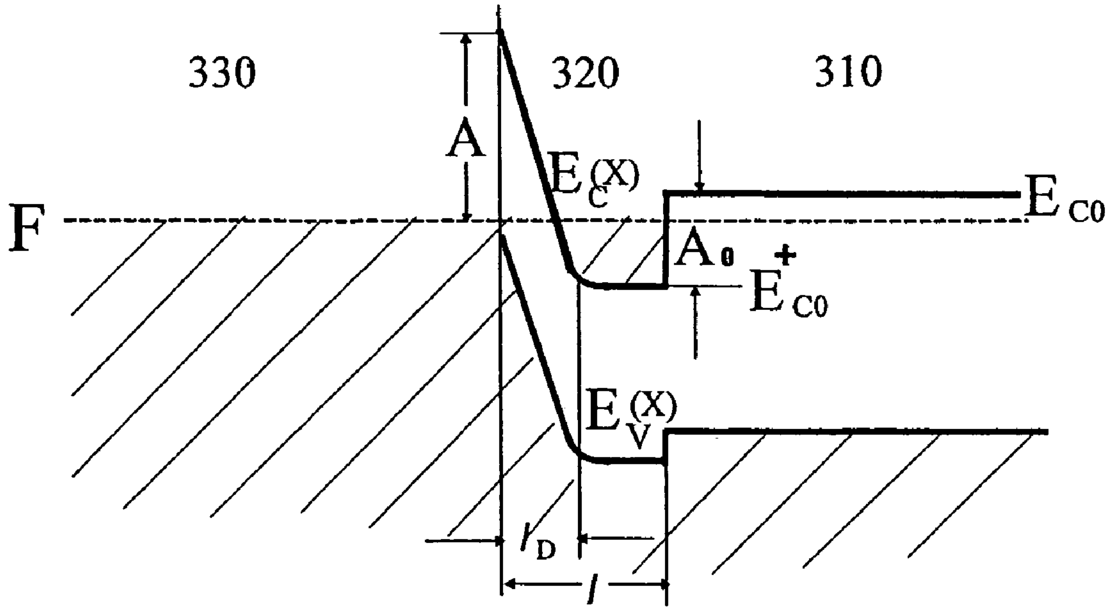
FIG. 3C illustrates an exemplary energy diagram of spin polarizer shown in FIG. 3A along the line III-III in the case when the n-S region is a nondegenerate semiconductor.

FIG. 3C illustrates an exemplary energy diagram of spin polarizer 300 along the line III-III of FIG. 3A in the case when the n-S region 310 is a nondegenerate nonmagnetic semiconductor. The device 300 can advantageously be used at relatively high temperatures, including room temperatures, and may ensure spin polarization of electrons close to 100% in the nonmagnetic semiconductor near the boundary with the n.sup..+-.S layers 320. F is the Fermi level; Δ and l.sub.D are the height and thickness of the Schottky barrier at the FM-$n^+$S' interface, l is the thickness of the highly doped $n^+$-S' layer 320, $\Delta_0$ is a jump at the bottom of the conduction band, $E_c(x)$, at the boundary of the $n^+$-S' layer 320 and the semiconductor 310.

The FM-$n^+$-S' junction shown in FIGS. 3A-3C at certain parameters presented below ensures a spin polarization of current, P.sub.Jl, near the boundary between the $n^+$-S' layer 320 and the semiconductor 310, the point x=l, weakly depending on the current. These conditions ensure the 100% spin polarization of electrons in some area of the semiconductor 310 near the boundary even for a relatively small value of P.sub.Jl as will be described in further detail below.

Figure 1A:
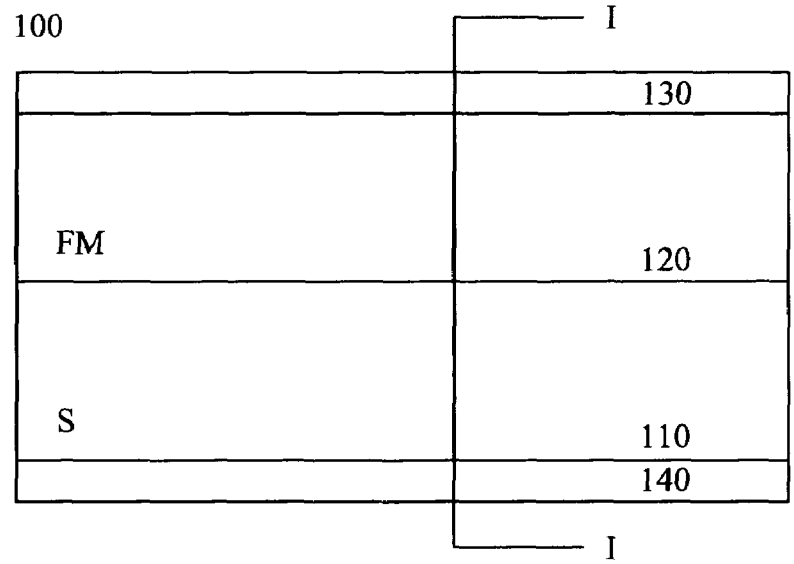
FIG. 1A (PRIOR ART)
FIG. 1A illustrates a schematic of a conventional ferromagnetic metal-semiconductor Schottky junction.
Figure 1B:
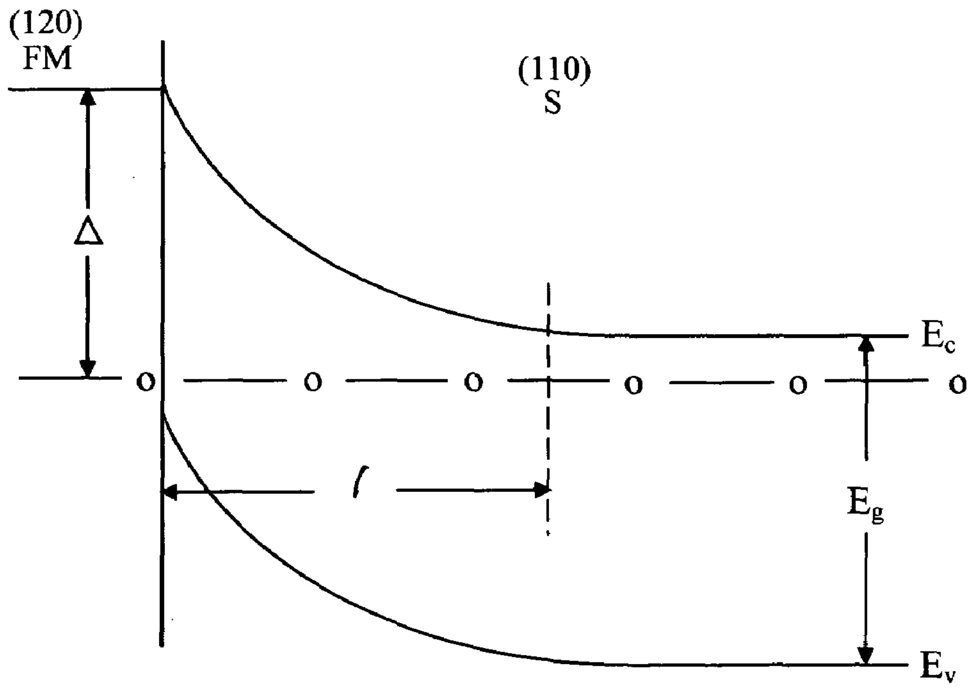
FIG. 1B (PRIOR ART)
FIG. 1B illustrates an energy band diagram of the conventional Schottky junction 100 illustrated in FIG. 1A along the line I-I.
Figure 2A:
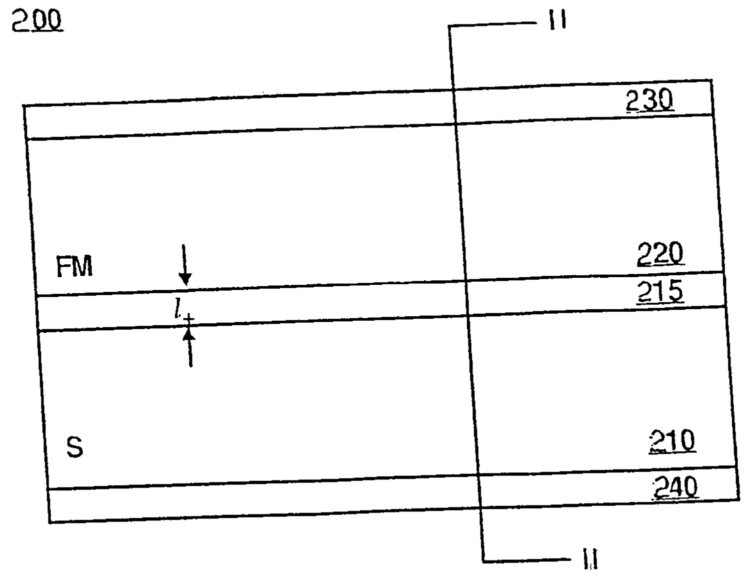
FIG. 2A illustrates a schematic of an earlier proposed spin injection device that is a modified Schottky ferromagnetic-semiconductor junction with an ultrathin high doped layer, the δ-doped layer, between the ferromagnet and semiconductor.
Figure 2B:
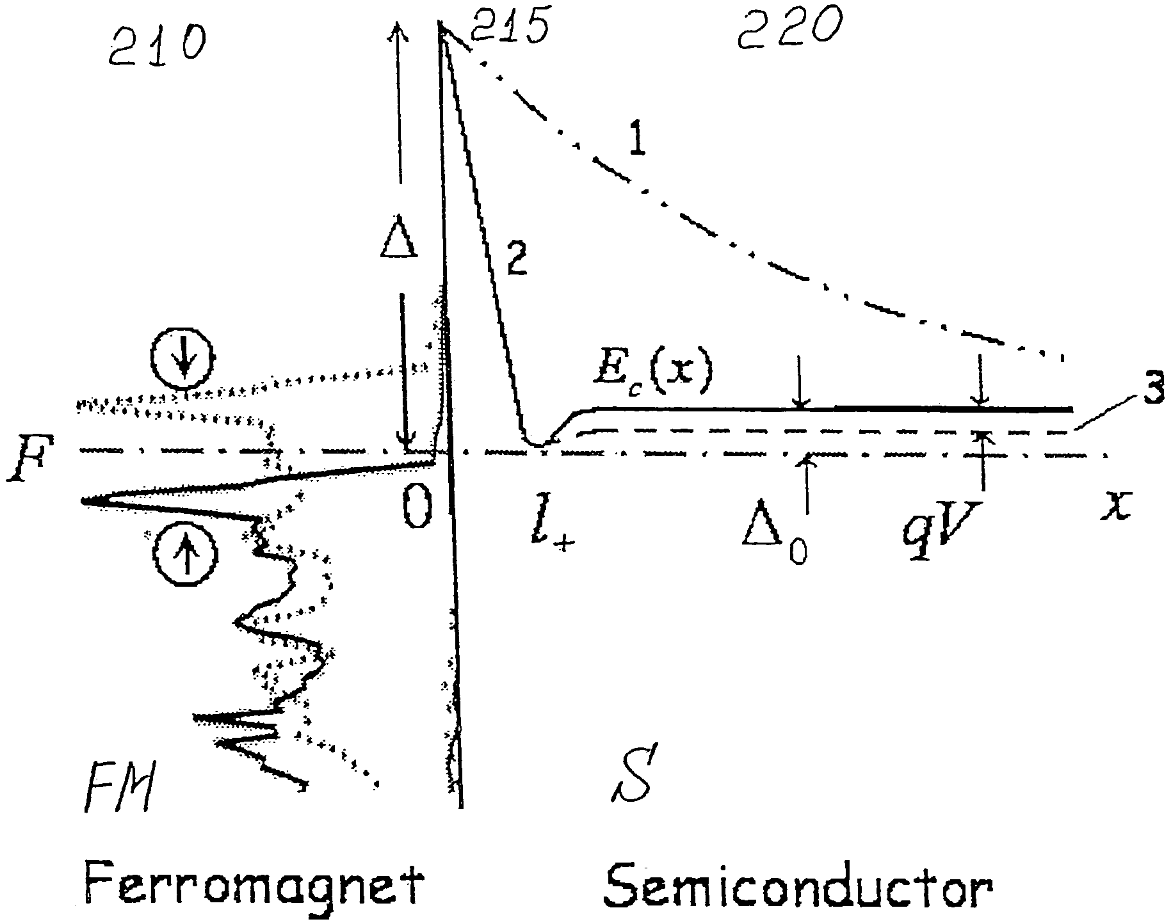
FIG. 2B illustrates an energy diagram of the spin injection device shown in FIG. 2A along the line II-II.

The currents of electrons with spin σ=↑, ↓ in NS are given by the following equations (See, for example, Ref's [7], [8], [16], and [17]):

$$J_\sigma = q\mu n_\sigma E + qD(dn_\sigma/dx), \tag{2}$$

$$dJ_\sigma/dx = q\delta n_\sigma/\tau_s, \tag{3}$$

where D, μ and $\tau_s$ are the diffusion constant, mobility and spin-coherence lifetime of the electrons, respectively, and E the electric field. From conditions of continuity of the total current $J(x)=J_\uparrow+J_\downarrow$=const and quasineutrality $$n(x) = n_\uparrow + n_\downarrow = n_S \tag{4}$$

it follows that $$E(x) = J/q\mu n_S = const \tag{5}$$

and $$\delta n_\uparrow(x) = n_\uparrow - n_S/2 = -\delta n_\downarrow(x) \tag{6}$$

where $n_S$ is total electron density in the semiconductor 310. From Equations (2) through (6), it follows that spin density in the semiconductor 310, that is, for x≧l can be written as:

$$\delta n_\uparrow(x) = \delta n_{\uparrow l}\exp[-(x-l)/L] = {}_{nl}(n_S/2)\exp[-(x-l)/L] \tag{7}$$

where $$L = (1/2)\{[(L_E)^2+(2L_S)^2]^{1/2} - (\pm)L_E\} == L_S\{[(1+(J/2J_S)^2]^{1/2} - J/2J_S\}, \tag{8}$$

$$L_S = \sqrt{D\tau_S} \text{ and } L_E = \mu\tau_s|E| = L_s|J|/J_S \tag{9}$$

are the diffusion and drift lengths of electron spin, respectively; the index ±corresponds to the forward, J>0, and reverse bias voltage, J<0, respectively. Here we introduce a typical current:

$$J_S \equiv qn_S D/L_s = qn_S L_s/\tau_s \tag{10}$$

and spin polarization of electrons in the semiconductor 310 (for x≧l)

$$P_n = (\delta n_\uparrow - \delta n_\downarrow)/n_S = P_{nl}\exp[-(x-l)/L], \tag{11}$$

where $$P_{nl} = P_{nl} = P_n(l) = (\delta n_{\uparrow l} - \delta n_{\downarrow l})/n_S = 2\delta n_{\uparrow l}/n_S \tag{12}$$

is spin polarization of electrons at the boundary of the semiconductor 310 (at the point x=l, FIG. 1). From Equations (2) and (7) the spin currents at the point x=l is $$J_{\uparrow l,\downarrow l} = (J/2) \cong (J_S/2)(L/L_S)P_{nl} \tag{13}$$

From Equation (13) it follows that the relationship between the spin polarization of current $$P_{Jl} = (J_{\uparrow l} - J_{\downarrow l})/(J_{\uparrow l} + J_{\downarrow l})/ = (J_{\uparrow l} - J_{\downarrow l})/J \tag{14}$$

and the spin polarization of electrons, $P_{nl}$, at the point x=1

$$P_{nl} = -P_{Jl}(JL_s)/(J_S L) \tag{15}$$

($P_{Jl}$ is also called spin injection coefficient of the FM-$n^\pm$S' contact.)

According to Equation (8) $L=L_s$ at $J<<J_S$ therefore, as expected $P_{nl}$ θ-J at $P_{Jl}>0$ (in certain cases $P_{Jl}<0$). In the reversed-biased FM-S junctions, J<0, according to (15) the value of $P_{Jl}=2\delta n_{\uparrow l}/n_S>0$ ($\delta n_{\uparrow l}>0$), that is, the accumulation of electrons with spin σ=↑ is realized in the semiconductor 310 near the boundary with the FM-S junction. At $|J|>J_S$ the spin penetration depth L (8) increases with current J and $P_{nl}\to P_{Jl}$ at $|J|>>J_S$. Thus, the spin polarization of electrons in the semiconductor injected from FM can achieve spin polarization of current in the reversed-biased FM-S junction.

Another situation is realized in the forward-biased FM-S junctions, J>0, when electrons drift under the action of the electric field from the semiconductor into FM. Here the value $\delta n_{\uparrow l}<0$ and $\delta n_{\downarrow l}>0$ at $P_{Jl}>0$, that is, electrons with spin σ=↑ are extracted from NS and electrons with spin σ=↓ are accumulated in the NS. The opposite situation is realized at $P_{Jl}<0$. At $J>J_S$ the spin penetration depth L (Equation (8)) decreases with current J and according to Equation (15) $|P_{nl}|$ rises to 1 (100%) at:

$$J = J_t \equiv J_S[|P_{Jl}|/(1+|P_{Jl}|)]^{-1/2} \tag{16}$$

when $$L=L_t=L_s[|P_{Jl}|/(1+|P_{Jl}|)]^{1/2} \quad (17)$$

Thus, spin polarization of electrons in the semiconductor near the forward-biased FM-S junction achieves 100% even at relatively small spin polarization of current, $P_{Jl}$, in the FM-S junction. This is valid both for a degenerate semiconductor 310, as shown in FIG. 3B, and for a nondegenerate semiconductor 310, as shown in FIG. 3C. The value of $P_{Jl}$, determines the threshold current, $J_t$, and spin penetration depth, $L_t$, but it does not change the main result:

$$|P_{nl}|=1 \text{ at } J=J_t. \quad (18)$$

The one requirement is a weak dependence of the spin polarization of current in the FM-S junction (or spin injection coefficient) $P_{Jl}$, on the current J. We note that when the current $J>J_t$ the value $|P_{nl}|=2|\delta n_{\uparrow l}|/n_S=|2n_{\uparrow l}-n_S|/n_S$ becomes formally more than 1, that is, the density of electrons $n_{\uparrow l}$ or $n_{\downarrow l}$ with spin $\sigma=\uparrow$ or $\sigma=\downarrow$ at the point x=l becomes more than the total electron density $n_S$. This means that the condition of quasineutrality (4) is violated and a negative space charge arises near the boundary of the semiconductor with the FM-S junction, x=l in FIG. 1. This charge will decrease the ohmic field $E=J/q\mu n_S$ (5), and consequently the drift spin length $L_E=\mu\tau_s|E|$. As a result the spin penetration depth L (Equation (8)) stops decreasing with current J and the values of the spin density $P_{nl}$ and L are stabilized near $|P_{nl}|=1$ and $L=L_t$, respectively.

Thus, embodiments of the present invention provide FM-S junctions which have the spin polarization of P.sub.Jl, weakly depending on the current J in the junctions. This requirement is valid, in particular, for the FM-n$^+$-S' junction shown in FIGS. 3A-3C when the n$^+$-S' layer 320 is a degenerate semiconductor and has the thickness, 1, of the n$^+$-S' layer 320 that satisfies the condition: 3l.sub.D<l<L.sub.S.sup.+(19) wherein L.sub.S.sup.+ ={square root over (D.sup.+.tau..sub.s.sup.+)}, D.sup.+ and .tau..sub.S.sup.+ are the length of electron spin, diffusion constant, and the spin-coherence lifetime of the electrons in the n$^+$-S' layer 320, respectively; l.sub.D is the width of the Schottky depletion layer in the n-semiconductor 320 near the FM-n$^+$-S' interface which is represented by the following equation: l.sub.D=(2.epsilon..epsilon..sub.0.DELTA./ q.sup.2N.sub.d.sup.+).sup.1/2 (20) wherein .epsilon..sub.0 is the permittivity of free space, .epsilon. is the relative permittivity of the n.sup.+-semiconductor 320, q>0 is the elementary charge, and N.sub.d.sup.+ is the concentration of shallow donors in the highly doped n$^+$-S' layer 320. The part of the n$^+$-S' layer 320, corresponding to x such that l.sub.D<X<l, shown in FIG. 3B, should be a degenerate semiconductor which has the electron density n.sup.+ =N.sub.d.sup.+. This means that n.sup.+=N.sub.d.sup.+ should correspond to a case when the Fermi level F>E.sub.co.sup.+ in this part, as shown in FIGS. 3B and 3C. This is realized when l>3l.sub.D and the donor concentration N.sub.d.sup.+ satisfies the condition 4.pi.N.sub.d.sup.+ a.sub.B.sup.3/3>1, where a.sub.B is the Borh radius of the shallow donor. The donor concentration N.sub.d.sup.+ in the n$^+$-S' layer 320 has to be much more than a donor concentration N.sub.d in the n-semiconductor 310 which can be either a degenerate semiconductor, as shown in FIG. 3B, or a nondegenerate semiconductor, as shown in FIG. 3C. Moreover, the following condition should be satisfied: l.sub.D>l.sub.0 (21) where l.sub.0 is given by Eq. (1). More precise requirements for the parameters l.sub.D, l and N.sub.d.sup.+ are presented below.

Because of the very high density of electrons in the FM metal 330 and the degenerate semiconductor layer 320 the tunneling current through the FM-n$^+$-S' layer is determined by the well-known formula (See, for example, Ref.'s [18] and [19]): J .sigma.0=qh.times..intg.dE.function.[f.function.(E-F-eV)-f.function.(E-F)].times..intg.d2.times.k (2.times..pi.)2.times.T.sigma.(22 ) where k.sub.II is the component of the wave vector k parallel to the FM-S interface, f(E-F) the Fermi function, V is a bias voltage and T.sub.sigma is the tunneling transmission probability of the FM-n$^+$-S' junction.

The value of $T_\sigma$ may be estimated in a semiclassical approximation (WKB) (See, for example, Ref.'s [14] and [15]) as follows:

$$T_\sigma = \frac{16\alpha v_{\sigma x} v_x}{v_{\sigma x}^2 + v_{tx}^2}\exp(-\eta\kappa l_D) \quad (23)$$

where $v_{\sigma x}$ is the x-component of velocity $v_\sigma$ of electrons with the wave vector k and spin $\sigma$ in a direction of current; $\kappa=(\Delta+F-E+E_{II})^{3/2}[\Delta(\Delta-qV)l_0]^{-1}$, $v_{xt}=h\kappa/2\pi m^*$ is the "tunneling" velocity; $E_{II}=h^2k_{II}^2/8\pi^2m^*$; m* and $v_x=[2(E-E_{c0}-qV-E_{II})/m^*]^{1/2}$ are an effective mass and x-component of the velocity of electrons in n$^+$-semiconductor layer 320; $\alpha=1.2(\kappa l_D)^{1/3}$ and $\eta=4/3$ or $\alpha=1$ and $\eta=2$ for the Schottky barrier of triangular or rectangular shape, respectively. The real shape of the barrier is not significant. For definiteness we consider the case when the temperature $k_BT \ll \mu^+s=(F-E_{c0})$.

Taking into account that the velocity $v_x$ is real only at $E>E_{c0}+qV+E_{II}$ and also a property of the Fermi function at $k_BT \ll \mu^+s$ one can find from Equations (22) and (23) that the spin current at the FM-n+-S' interface, at the point x=0 in FIG. 1, can be written at $qV \leqq \mu^+s$ as:

$$J_{\sigma 0} = qn_S^+ v_\mu \alpha_0 T_t(V) d_\sigma [1-(1-qV/\mu_S^+)^{5/2}], \quad (24)$$

$$T_t(V) = \exp\left[-\frac{\eta l_D(\Delta-qV)^{1/2}}{l_0\Delta^{1/2}}\right], \quad (25)$$

$$d_\sigma = \frac{v_\mu v_{\sigma 0}}{v_{t0}^2 + v_{\sigma 0}^2}, \quad (26)$$

wherein $v_{\sigma 0}=v_\sigma(F+qV)$ and $v_\mu=(3\mu_S^+/m^*)^{1/2}$ are velocities of electrons with spin $\sigma$ and the energies E=F+qV and $\mu_s^+$ in FM and n+-S' layers 330 and 320, respectively; $v_{t0}=(2(\Delta-qV)/m^*$. From Equations (24)-(26) it follows that the total current $J=J_{\uparrow 0}+J_{\downarrow 0}$ is equal to:

$$J=J_0 d_\sigma[1-(1-qV/\mu_s^+)^{5/2}], \quad (27)$$

wherein $$J_0=dqn_s^+ v_\mu \alpha_0 T_t(V) \quad (28)$$

$$d_0=(d_\uparrow+d_\downarrow) \quad (28)$$

and the spin polarization of current, $P_{j0}$, at the FM-n+-S' interface is equal to:

$$P_{J0} = \frac{J_{\uparrow 0} - J_{\downarrow 0}}{J_{\uparrow 0} + J_{\downarrow 0}} = \frac{(v_{\uparrow 0} - v_{\downarrow 0})(v_{t0}^2 - v_{\uparrow 0}v_{\downarrow 0})}{(v_{\uparrow 0} + v_{\downarrow 0})(v_{t0}^2 + v_{\uparrow 0}v_{\downarrow 0})} \equiv P_F \quad (29)$$

The expression for P.sub.j0=P.sub.F coincides with that for spin polarization of current in usual tunneling FM-I-FM structures [18,19]. One can see that P.sub.j0.sup.--=P.sub.F does not depend on the current. When the thickness of the $n^+$-S' layer l<<L.sub.S.sup.+, where L.sub.S.sup.+=(D.sup.+ .tau..sub.S.sup.+).sup.1/2 and .tau..sub.S.sup.+ are the length and relaxation time of electron spin in the $n^+$-S' layer, but l>l.sub.D, spin currents in the $n^+$-S' layer do not change practically, therefore we can put J.sub..sigma.0=J.sub..sigma.l and P.sub.j0=P.sub.Jl where P.sub.Jl is the spin polarization of the current at the boundary between the $n^+$-S' layer 320 and the n-S region 310. By analogy with Equation (13) the spin current in the $n^+$-S' layer is equal to $$J_{\uparrow l,\downarrow l}=(J/2)\cong(J_S{}^+/2)P^+{}_{nl} \tag{30}$$

wherein $P^+{}_{nl}=2\delta n^+{}_{\uparrow l}/n^+{}_S$ is the spin polarization of electrons in the $n^+$-S' layer changing with the typical length L.sub-.S.sup.+ and the typical current is:

$$J_S{}^+=qD^+n^+{}_S/L_S{}^+, \tag{31}$$

where $n^+{}_S$ is the electron density in the degenerated region of the $n^+$-S' layer.

Therefore for arbitrary l the value of P.sub.Jl=P.sub.F/cos h(l/L.sub.S.sup.+). Thus, P.sub.JI.apprxeq.P.sub.F when l<<L.sub.S.sup.+ in the considered FM-n.sup.+-n-S heterostructure shown in FIGS. 3A-3C. P.sub.Jl very weakly depends on the current, therefore according to Equations (15) and (18) the spin polarization electrons in the forward-biased FM-n.sup.+-n-S heterostructure near in the n-S region P.sub.n0=1(100%) at the threshold current and spin penetration depth in the n-S region is determined by Eqs. (16) and (17). Eqs. (16) and (17) are valid when the thickness of the $n^+$-S' layer $$l\aleph L_S(\beta^+{}_S/\beta_S)[(1+P_F)/P_F), \text{ but } l>3l_D. \tag{32}$$

The larger l is, the less P.sub.Jl is, and the greater the threshold current J.sub.t (Equation (15)) is.

The conditions of the 100% spin polarization electrons are $J_S{}^+ >> J_0 >> J_S$. Taking into account Equations (10), (28) and (31) these conditions can be written as:

$$\frac{n_S}{n_S^+}\left(\frac{D}{L_S v_\mu}\right) < T_t(\mu_S^+) << \left(\frac{D^+}{L_S^+ v_\mu}\right) \tag{33}$$

$$\frac{n_S^+}{n_S} >> \left(\frac{DL_S^+}{D^+L_S}\right) = \left(\frac{D\tau_S^+}{D^+\tau_S}\right)^{1/2}, \tag{34}$$

wherein the parameter $T_t(\mu_S{}^+)$ is equal to $$T_t(\mu_S^+) = d_0 \exp\left[-\frac{\eta l_D(\Delta-\mu_S^+)^{1/2}}{l_0\Delta^{1/2}}\right]. \tag{35}$$

The conditions of Equations (19) and (33)-(35) can be rewritten as:

$$\frac{2l_0}{\eta}\ln\left(\frac{L_S^+ v_\mu d}{D^+}\right) < l_D < \frac{l_0}{\eta}\ln\left(\frac{n_S^+ L_S v_\mu d}{n_S D}\right) \tag{36}$$

$$3l_D \le l\aleph L_S^\pm \tag{37}$$

where $l_D$ is given by Equation (20), that is, $l_D$ is determined by $n_S{}^+=N_d{}^+$.

The condition of Equations (33)-(36) determine the requirements of the electron densities $n_S=N_d$ and $n_S{}^+=N_d{}^+$ in the n+-S' layer 320 and the n-semiconductor 310, the thickness $l_D$ of the Schottky depletion layer of FM-$n^+$-S' junction, the thickness l of the $n^+$-S' layer and also the value of a jump $\Delta_0$ of the bottom of the conduction band, $E_c(x)$, at the boundary of the n±S' layer 320 and the semiconductor 310, $\Delta_0=(E_{c0}-E_{c0}{}^+)$ both for the case of a degenerate semiconductor 310 as shown in FIG. 3B and for the case of a nondegenerate semiconductor 310 as shown in FIG. 3C. Here $E_{c0}$ and $E_{c0}{}^+$ are the bottom of the conduction band in the semiconductor 310 and the thin degenerate semiconductor $n^+$-layer 320 near the semiconductor 310. Typical parameters for Ni—GaAs—GaAlAs heterosructure are $N_d{}^+\approx10^{18}$-$cm^{-3}$-$10^{19}$-$cm^{-3}$, $N_d{}^+\approx10^{16}$-$cm^{-3}$-$10^{17}$-$cm^{-3}$, Δ≈500 meV, $\mu_S{}^+\approx30$ mev-50 meV, $l_D\approx5$ nm, l≈15 mn, $l_0\approx1$ nm, $L_s\approx300$ nm, and $\Delta_0\approx\mu_S{}^+$).

Figure 4A:
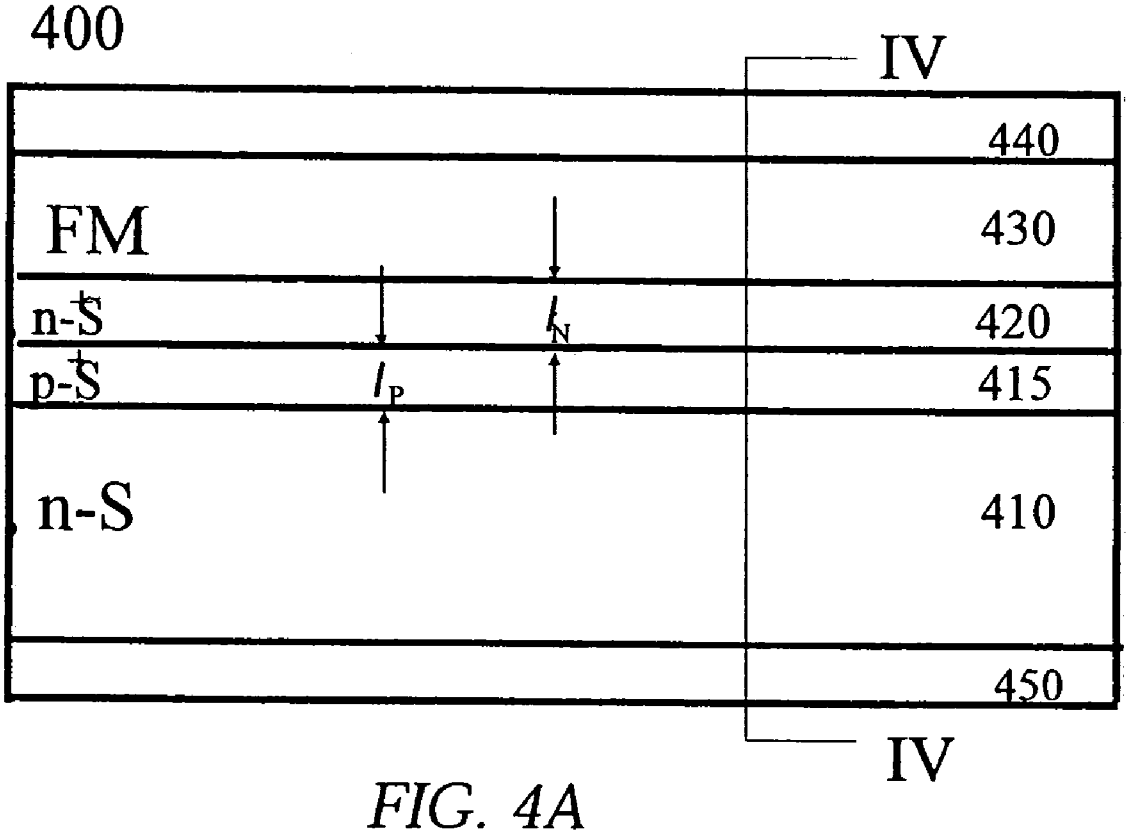
FIG. 4A illustrates an exemplary variant of a spin polarizer according to an embodiment of the present invention based on a ferromagnetic-semiconductor heterostructure including two thin negative and positive high doped degenerate semiconductor layers, n+-S and $p^+$-S, which are situated between the ferromagnet and negative doped semiconductor n-S region, and have the same energy bandgap than that of the n-semiconductor region.
Figure 4B:
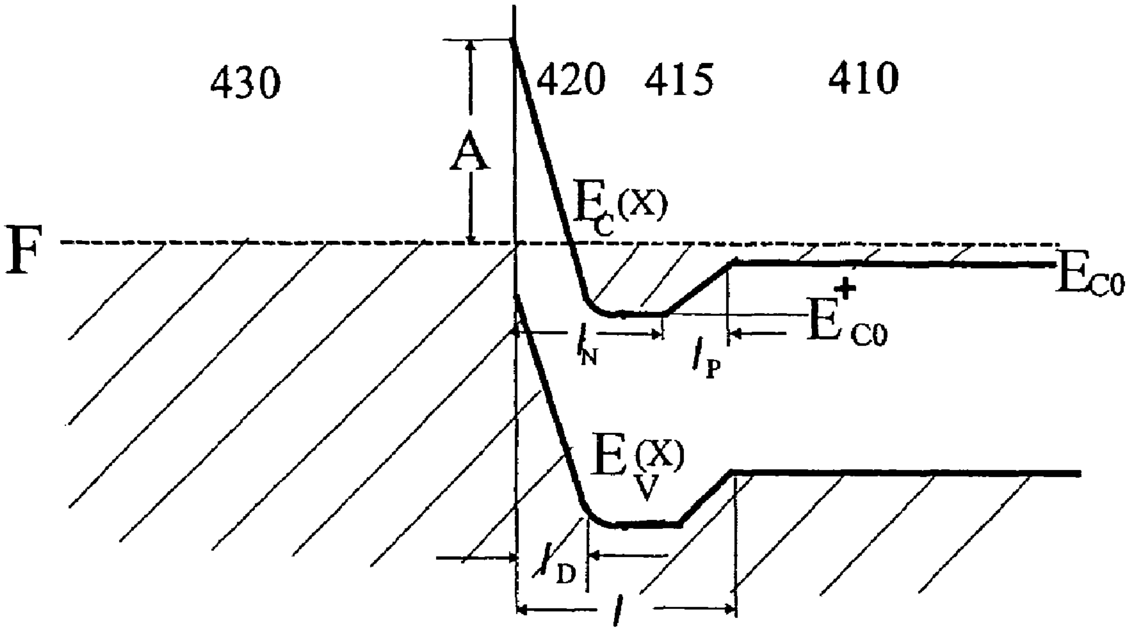
FIG. 4B illustrates an exemplary energy diagram of spin polarizer shown in FIG. 4A along the line IV-IV in the case when the n-S region is a degenerate semiconductor.
Figure 4C:
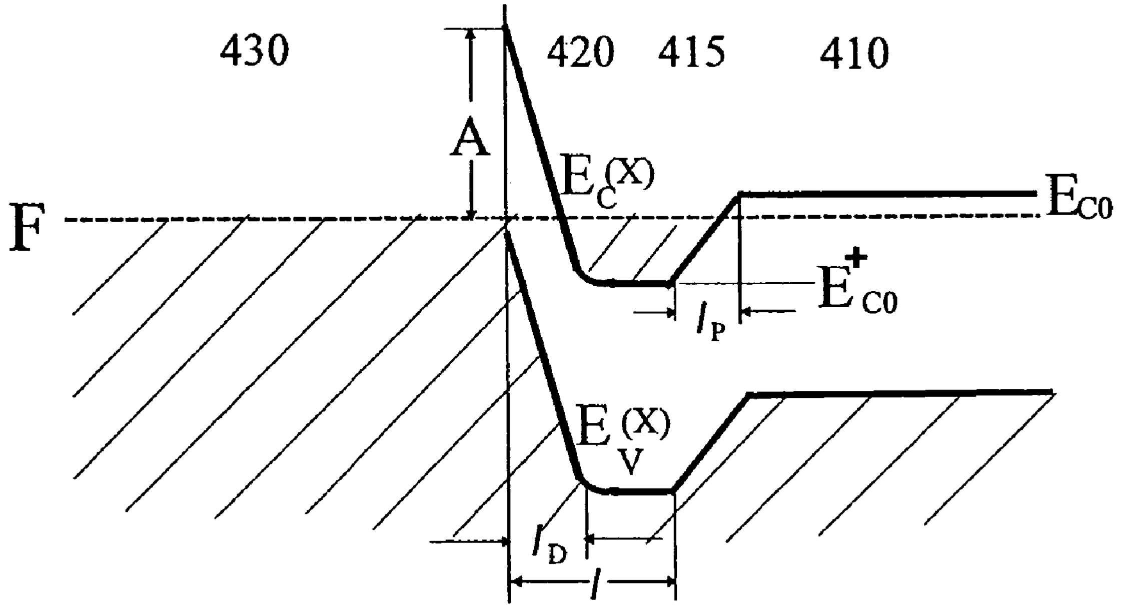
FIG. 4C illustrates an exemplary energy diagram of spin polarizer shown in FIG. 4A along the line IV-IV in the case when the n-S region is a nondegenerate semiconductor.

FIG. 4A illustrates a spin polarizer 400 according to another embodiment of the present invention. As shown, the spin polarizer 400 may include a nonmagnetic semiconductor 410, a ferromagnetic 430 and two thin negative and positive highly doped degenerate nonmagnetic semiconductor layers, n.sup.+-S layer 420 and p.sup.+-S layer 415. The negative highly doped $n^+$-S donor layer 420 is denoted by $l_N$ and the positive highly doped acceptor layer $p^+$-S layer 415 is denoted by $l_P$ as shown in FIG. 4A-4C and described in paragraphs [0079], [0081] and [0082].The layers 420 and 415 are situated between the ferromagnet 430 and negative doped semiconductor, n-S region 410, and have the same energy bandgap as that of the n-S region 410. These layers can be formed by heavily negative and positive doping of a portion of the semiconductor 410. The spin polarizer 400 may also include electrodes 440 and 450 electrically connecting the ferromagnetic layer 430 and the semiconductor 410, respectively. The spin polarizer 400 thus formed may be described as having a FM-n.sup.+-p.sup.+-n-S heterostructure with parameters adjusted to sufficiently meet the conditions described below.

The ferromagnetic layer 430 may be formed from various magnetic materials, preferably Ni, Fe and Co, as well as various magnetic alloys, which may include one or a combination of Fe, Co, Ni. The semiconductor 410 may be formed from various nonmagnetic semiconductor materials including Si, GaAs, ZnTe, GaSb, GaP, Ge, InAs, CdSe, InP, InSb, CdTe, CdS, ZnS, ZnSe, AlP, AlAs, AlSb and also alloys of these materials. In general, it is preferred that the semiconductor 410 be formed from semiconductor materials with relatively large electron spin relaxation time, $L_s$, for example GaAlAs, InAs, ZnSe and ZnCdSe. The semiconductor 410 can be negatively doped.

FIG. 4B illustrates an exemplary energy diagram of the spin polarizer shown in FIG. 4A along the line IV-IV in the case when the n-S region is a degenerate nonmagnetic semiconductor. The device 400 may be used at arbitrary temperature and may ensure spin polarization of electrons close to 100% in an area of the nonmagnetic semiconductor near the boundary with the p.sup.+-S layer 415. F is the Fermi level; .DELTA. and l.sub.D are the height and thickness of the Schottky barrier of the FM-n.sup.+-S junction, l.sub.P is the total thickness of the highly doped p.sup.+-S layer 415, 1 is the total thickness of the high doped n.sup.+-S layer 420 and the p.sup.+-S layer 415, E.sub.c(x) is the bottom of the conduction band and E.sub.v(x) is the top of the valence band of the semiconductor 420, 415 and 410, E.sub.c0 and E.sub.c0.sup.+ are the bottoms of the conduction band in the n-S region 410 and the part of the n.sup.+-S layer 420 corresponding to a region of the degenerate semiconductor, where $l_D<x<(l-l_P)$.

FIG. 4C illustrates an exemplary energy diagram of the spin polarizer shown in FIG. 4A along the line IV-IV in the case when the n-S region is a nondegenerate nonmagnetic semiconductor. The device 300 can be used at relatively high temperatures, including room temperatures, and can ensure spin polarization of electrons close to 100% in an area of the nonmagnetic semiconductor near the boundary with the p.sup.+-S layer 415. F is the Fermi level; .DELTA. and l.sub.D are the height and thickness of the Schottky barrier of the FM-n.sup.+-S junction, l.sub.P is the total thickness of the highly doped p.sup.+x -S layer 415, l is the total thickness of the highly doped n.sup.+-S layer 420 and the p.sup.+-S layer 415, E.sub.c(x) is a bottom of the conduction band and E.sub.v(x) is a top of the valence band of the semiconductors 420, 415 and 410, E.sub.c0 and E.sub.c0.sup.+, are the bottoms of the conduction band in the n-S region 410 and the part of the n.sup.+-S layer 420 corresponding to the degenerate semiconductor corresponding to $l_D<x<(l-l_p)$.

A spin polarization close to 100% in the FM-n.sup.+-p.sup.+-n-S heterostructure shown in FIG. 4 can be achieved if the following condition is satisfied:

$$l_D \leq l_p \leq l \ll L_S^{\pm} \tag{38}$$

and $$N_a l_p^2 \approx 2\epsilon\epsilon_0(E_{c0}-E_{c0}^{+})/q^2 \tag{39}$$

wherein E.sub.c0 and E.sub.c0.sup.+ are the bottoms of the conduction band in the n-S region 410 and the part of the n.sup.+-S layer 420 corresponding to the degenerate semiconductor, where $l_D<x<(l-l_p)$, in FIGS. 4B and 4C, respectively. For example, equations (38) and (39) may be satisfied if N.sub.d ranges between 10.sup.18 cm.sup.-3 and 10.sup.19 cm.sup.-3, l.sub.p.ltoreq.30 nm, and E.sub.c0 and (E.sub.c0-E.sub.c0.sup.+).apprxeq.50 meV. When the conditions of Equations (38) and (39) are satisfied the region of the n.sup.+-S layer 420 and the p.sup.+-S layer 415 corresponding to l.sub.D<x<l is a degenerate semiconductor and the energy diagram of the FM-n.sup.+-p.sup.+-n-S heterostructure, spin polarizer, has the form shown in FIG. 4B or 4C for the case when the n-S region 410 is a degenerate semiconductor or nondegenerate semiconductor, respectively. One can see that these energy diagrams coincide qualitatively with those shown in FIGS. 3B and 3C. Therefore, all results presented above for the FM-n.sup.+-S heterostructure shown in FIGS. 4A-4C are valid for the FM-n.sup.+-p.sup.+-n-S heterostructure, spin polarizer, shown in FIGS. 4A-4C.

All of the above described structures and conditions are also valid for a negatively doped semiconductor. In this case the words electrons, donor and acceptor should be substituted for the words holes, acceptor and donor, respectively, and the n-, $n^+$- and p-semiconductor regions should be substituted for p-, $p^+$- and n-semiconductor regions.

Different spintronic devices based on ferromagnetic-semiconductor-ferromagnetic (FM-S-FM) structures have been suggested, including those using an electric field [5,6], external magnetic field [7], and a nanowire current [8] to control an electron spin. All of these devices are spin valves where one of FM-S junctions works as a spin injector and another one as a spin filter. The spin filter efficiently admits electrons with a certain spin projection and efficiently reflects electrons with the opposite spin. The spin polarizer and the FM-$n^+$-n-S heterostructures shown in the FIGS. 3 and 4 according to an embodiment of the present invention can be used as the spin filter and spin injector in all of these devices and also in semiconductor systems for quantum computing.

Figures 5A, 5B:
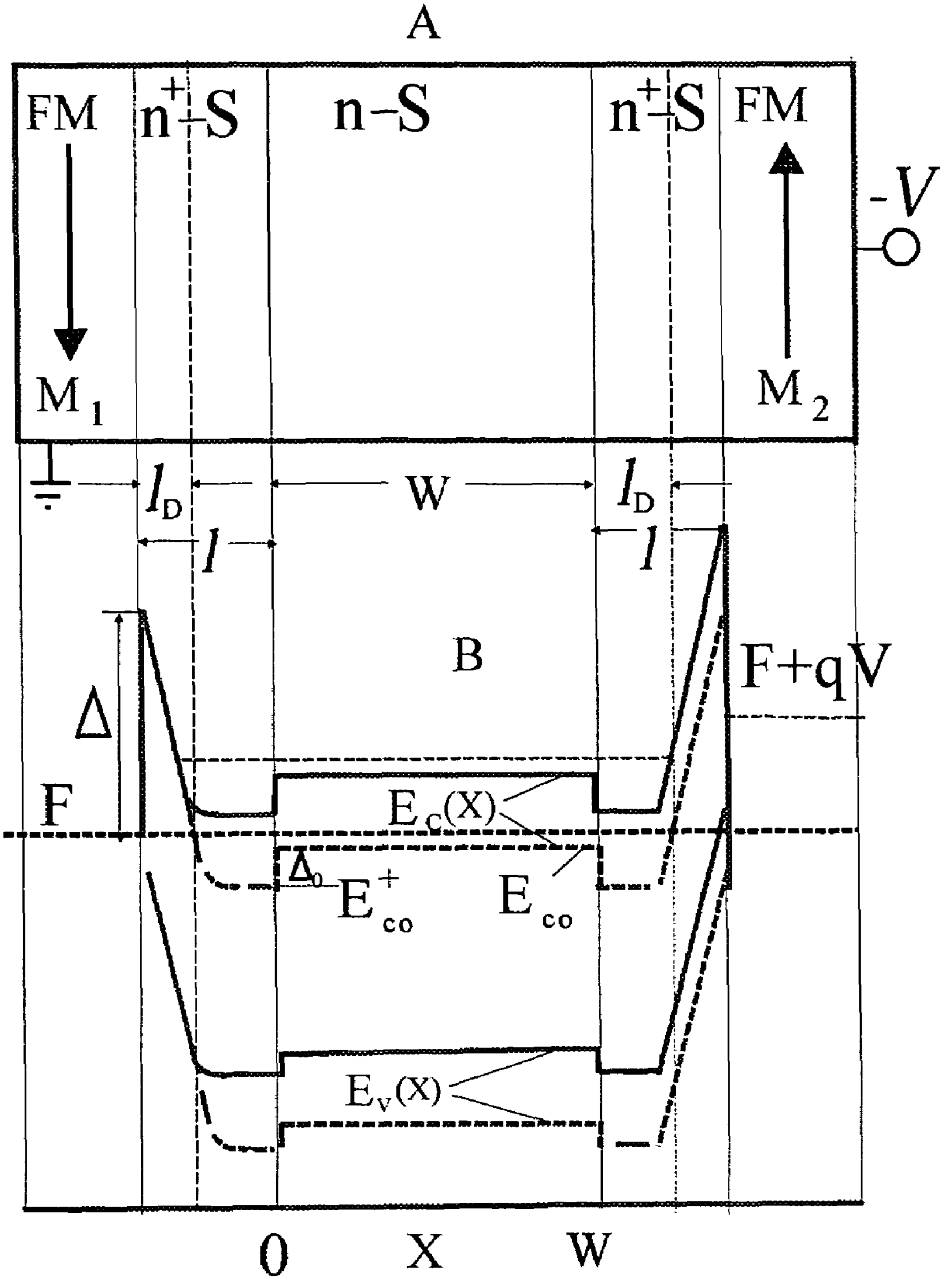
FIG. 5A illustrates and exemplary variant of a spin device according to an embodiment of the present invention based on a ferromagnetic-semiconductor layer localized between two ferromagnetic metal layers.
FIG. 5B illustrates an exemplary energy diagram corresponding to the spin device of FIG. 5A.

One of possible variant of use of the spin polarizer and the FM-$n^+$-n-S heterostructures is shown in FIG. 5. FIG. 5A illustrates an exemplary variant of a spin device according to an embodiment of the present invention based on a ferromagnetic-semiconductor FM-$n^+$-n-$n^+$-FM heterostructure containing a donor doped nonmagnetic semiconductor (n-S) layer localized between two ferromagnetic metal (FM) layers and also two thin layers of a heavily doped degenerate semiconductor ($n^+$-S layers) between the n-S and FM layers. FIG. 5B illustrates an exemplary energy diagram of the spin devise shown in FIG. 5A in equilibrium (broken curves) and at a bias voltage V (solid curves) in the case when the $n^+$-S layers have a narrower energy bandgap than that of the n-S region and the n-S region is a degenerate semiconductor (for the nondegenerate n-S region $E_{C0}>F$). Here F is the Fermi level in equilibrium, $E_C(x)$ is bottom of semiconductor conduction band, $E_{c0}$ and $E_{C0}{}^{+}{}_{-}$ are the values of $E_C(x)$ in the n-S and $n^+$-S layers, respectively; w and l thickness of the n-S and $n^+$-S layers, respectively; $\Delta$ and $l_{D\_}$ are the height and thickness of the Schottky barrier of the FM-$n^+$-S junctions. One of the two FM-$n^+$-S contacts is used as a spin injector and another as a spin filter. Such FM-$n^+$-n-$n^+$-S heterostructures ensure spin polarization of electrons is equal substantially to 100% inside the nonmagnetic semiconductor layer when its thickness, w, is less than $L_s$ and magnetizations, $M_1$ and $M_2$ have opposite direction, as it is shown in the FIG. 5A. This occurs even in these cases when spin polarization of the current in FM-$n^+$-S contacts, $P_J$, are relatively small ($P_J$ can be even ~5%-15%).

The present invention has been described with reference to an exemplary embodiment. However, it will be readily apparent to those skilled in the art that it is possible to embody the invention in specific forms other than that of the exemplary embodiment described above. This may be done without departing from the spirit and scope of the invention. The exemplary embodiment is merely illustrative and should not be considered restrictive in any way. The scope of the invention is given by the appended claims, rather than the preceding description, and all variations and equivalents that fall within the range of the claims are intended to be embraced therein.

What is claimed is:

1. A spintronics device spin polarizer, comprising:

a nonmagnetic semiconductor;

a ferromagnetic layer formed above the semiconductor; and a thin degenerate semiconductor layer formed between the ferromagnetic layer and the semiconductor, wherein the thin degenerate semiconductor layer is more highly doped than the semiconductor;

wherein the concentration of shallow donors $N_d^+$ in the thin degenerate semiconductor layer satisfies the condition $4\pi N_d^+ \alpha_B^3/3>1$, where $a_B$ is the Borh radius of the shallow donor; and wherein the thickness, l, of the thin degenerate semiconductor layer satisfies the condition: $6l_0 \leqq 2l_D \leqq l \ll L_s^+$ wherein:

$l_0$ represents a tunneling length for a Schottky barrier near a junction between the ferromagnetic layer and the thin degenerate semiconductor layer given by the equation $l_0=(\hbar^2/8\pi^2 m^* \Delta)^{1/2}$; where $\hbar$ represents the Planks constant;

m* represents the effective mass of electrons in the thin degenerate semiconductor layer;

Δ represents the height of the Schotty barrier;

$l_D$ represents a thickness of the Schottky barrier given by $l_D=(2\epsilon\epsilon_0\Delta/q^2N_d^+)^{1/2}$; and $L_S^+$ represents a length of electron spin in the thin degenerate semiconductor layer given by the equation $L_S^+=\sqrt{D^+\tau_S^+}$ where $D^+$ and $\tau_S^+$ are diffusion coefficient and time of spin coherence of electrons in the thin degenerate semiconductor layer, respectively.

2. The device of claim 1, wherein the ferromagnetic layer is formed from magnetic semiconductors.

3. The device of claim 1, wherein the ferromagnetic layer is formed from magnetic metals.

4. The device of claim 1, wherein the ferromagnetic layer is formed from any one of Ni, Fe and Co, or an alloy thereof.

5. The device of claim 1, wherein the semiconductor is formed from at least one semiconductor material selected from the list consisting of: Si, GaAs, ZnTe, GaSb, GaP, Ge, InAs, CdSe, InP, InSb, CdTe, CdS, ZnS, ZnSe, AlP, AlAs, AlSb, CuI, CuCl, CuBr.

6. The device of claim 1, wherein the semiconductor is formed from an alloy of any of Si, GaAs, ZnTe, GaSb, GaP, Ge, InAs, CdSe, InP, InSb, CdTe, CdS, ZnS, ZnSe, AlP, AlAs, AlSb, CuI, CuCl, CuBr.

7. The device of claim 1, wherein the semiconductor has a large electron spin relaxation length, $L_s$.

8. The device of claim 1, wherein:

the thickness l of the thin degenerate semiconductor layer is greater than 1 nanometer and less than or equal to 500 nanometers.

9. The device of claim 1, wherein the semiconductor and the thin degenerate semiconductor layer may be negatively doped such that a donor concentration $N_d^+$ in the thin degenerate semiconductor layer is greater than a donor concentration $N_d$ in the semiconductor.

10. The device of claim 9, wherein the thin degenerate semiconductor layer is doped with n-dopant metals selected from the group consisting of P, As, and Sb when the semiconductor is Si or Ge, and Ge, Se, Te, Si, Pb and Sn when the semiconductor is GaAs.

11. The device of claim 1, wherein the semiconductor and the thin degenerate semiconductor layer are positively doped such that an acceptor concentration $N_a^+$ in the thin degenerate semiconductor layer is greater than an acceptor concentration $N_a$ in the semiconductor.

12. The device of claim 1, wherein an energy band gap of the thin degenerate semiconductor layer is narrower than an energy band gap of the semiconductor by a value $\Delta_0=(E_{c0}-E_{c0}^+)$ for a negatively doped semiconductor layer, wherein $E_{c0}$ and $E_{c0}^+$ are bottoms of the conduction band in the semiconductor and the thin degenerate semiconductor layer near the semiconductor, and $\Delta_0=(E_{v0}-E_{v0}^+)$ for a positively doped semiconductor layer, wherein $E_{v0}$ and $E_{v0}^+$ are tops of the valence band in the semiconductor and the thin degenerate semiconductor layer near the semiconductor.

13. The device of claim 1, wherein:

a donor concentration of $N_d^+$ of the thin degenerate semiconductor layer substantially ranges from $10^{18}$ $cm^{-3}$ to $10^{20}$ $cm^{-3}$ for a negatively doped semiconductor layer, and an acceptor concentration of $N_a^+$ of the thin degenerate semiconductor layer substantially ranges from $10^{18}$ $cm^{-3}$ to $10^{20}$ $cm^{-3}$ for a positively doped semiconductor layer.

14. The device of claim 1, wherein the thin degenerate semiconductor layer is formed from at least one of various semiconductor materials selected from the group consisting of: Si Ge, GaAlAs, ZnTe, GaSb, GaAlP, InAsP, CdSeTe, InSbP, ZnCdS, AlAsP, AlAsSb, AlSb, CuClI, CuClBr, and alloys thereof.

15. The device of claim 1, wherein the thin degenerate semiconductor layer of thickness l satisfies the condition: $6l_0 \leqq 2l_D \leqq l \ll L_S^+$; and wherein the thin degenerate semiconductor layer is formed from the same negatively doped semiconductor material as the semiconductor layer.

16. The device of claim 15, wherein the thin degenerate semiconductor layer comprises two layers.

17. The device of claim 16, wherein one of said two layers is heavily donor doped, and the other of the two layers is heavily accepter doped.

18. The device of claim 17, wherein the donor heavily doped layer closes the ferromagnetic layer and accepter heavily doped layer closes the semiconductor.

19. The device of claim 18, wherein the accepter concentration, $N_a$, and thickness of the second accepter doped layer, $l_P$, satisfies conditions:

$$l_D \leqq l_P \leqq l \ll L_S^+ \text{ and } N_a l_P^2 \approx 2\epsilon\epsilon_0(E_{c0}-E_{c0}^+)/q^2$$

wherein:

ε represents a permittivity of the semiconductor;

$\epsilon_0$ represents a permittivity vacuum;

$l_D$ represents a thickness of the Schottky barrier given by $l_D=(2\epsilon\epsilon_0\Delta/q^2N_d^+)^{1/2}$;

$L_S^+$ represents a length of electron spin in the thin degenerate semiconductor layer given by the equation $L_S^+=\sqrt{D^+\tau_S^+}$ where $D^+$ and $\tau_S^+$ are diffusion coefficient and time of spin coherence of electrons in the thin degenerate semiconductor layer, respectively;

q>0 represents is the elementary charge, and $E_{c0}$ and $E_{c0}^+$ are bottoms of the conduction band in the semiconductor and the thin degenerate semiconductor layer near the semiconductor.

20. The device of claim 18, wherein the donor concentration, $N_d$, and thickness of the donor doped layer, $l_N$, satisfy conditions:

$$l_D \leqq l_N \leqq l \ll L_S^+ \text{ and } N_d l_N^2 \approx 2\epsilon\epsilon_0(E_{v0}-E_{v0}^+)/q^2$$

wherein:

ε represents a permittivity of the semiconductor;

$\epsilon_0$ represents a permittivity vacuum;

$l_D$ represents a thickness of the Schottky barrier given by $l_D=(2\epsilon\epsilon_0\Delta/q^2N_d^+)^{1/2}$;

$L_S^+$ represents a length of electron spin in the thin degenerate semiconductor layer;

q>0 represents is the elementary charge, and $E_{v0}$ and $E_{v0}^+$ are tops of the valence band in the semiconductor and the thin degenerate semiconductor layer near the semiconductor.

21. The device of claim 1 wherein a positive bias voltage is applied to the ferromagnetic layer and a negative bias voltage is applied to the semiconductor layer.

22. The device of claim 1, wherein:

a nonmagnetic semiconductor layer is localized between two ferromagnetic layers;

two thin degenerate semiconductor layers formed between the two ferromagnetic layers and the semiconductor layer which are more highly doped than the semiconductor layer; wherein the concentration of shallow donors $N_d^+$ in the thin degenerate semiconductor layers satisfies the condition $4\pi N_d^+a_B^3/3>1$, where $\alpha_B$ is the Borh radius of the shallow donor; and wherein the thickness, l, of the thin degenerate semiconductor layers satisfies the condition: $6l_0 \leqq 2l_D \leqq l \ll L_S^+$ wherein:

$l_0$ represents a tunneling length for a Schottky barrier between the ferromagnetic layers and the thin degenerate semiconductor layer given by the equation $$l_0=(\hbar^2/8\pi^2 m^*\Delta)^{1/2};$$

$L_S^+$ represents a length of electron spin in the thin degenerate semiconductor layer given by the equation $L_S^+=\sqrt{D^+\tau_s^+}$ where $D^+$ and $\tau_S^+$ are diffusion coefficient and time of spin coherence of electrons in the thin degenerate semiconductor layer, respectively;

$l_D$ represents a thickness of the Schottky barrier given by $l_D=(2\epsilon\epsilon_0\Delta/q^2N_d^+)^{1/2}$ wherein $\epsilon_0$ is the permittivity of free space, $\epsilon$ is the relative permittivity of the thin degenerate semiconductor layer, $q>0$ is the elementary charge, and $N_d^+$ is the concentration of shallow donors in the thin degenerate semiconductor layers, $\Delta$ is a height of the Schottky barrier; and the thickness of the nonmagnetic semiconductor layer w, is less than $L_S$, where $L_S$ represents a length of electron spin in the semiconductor layer given by the equation $L_S=\sqrt{D\tau_S}$ where D and $\tau_S$ are diffusion coefficient and time of spin coherence of electrons in the semiconductor layer, respectively; and magnetizations, $M_1$ and $M_2$, in the ferromagnetic layers are directed in opposite directions.

* * * * *